United States Patent
Chou et al.

(10) Patent No.: US 8,995,100 B2
(45) Date of Patent: Mar. 31, 2015

(54) CONFIGURABLE ELECTROSTATIC DISCHARGING POWER CLAMP AND RELATED INTEGRATED CIRCUIT

(75) Inventors: Hsiang-Ming Chou, Hsinchu (TW); Kuo-Liang Pan, Changhua County (TW); Chien-Feng Tseng, Hsinchu County (TW); Yi-Chiu Tsai, Tainan (TW); Chien-Shao Tang, Hsinchu (TW); Hsin-Han Chen, Tainan (TW)

(73) Assignee: Elite Semiconductor Memory Technology Inc., Hsinchu Science Park, Hsinchu (TW)

( * ) Notice: Subject to any disclaimer, the term of this patent is extended or adjusted under 35 U.S.C. 154(b) by 349 days.

(21) Appl. No.: 13/430,649

(22) Filed: Mar. 26, 2012

(65) Prior Publication Data

US 2013/0249046 A1    Sep. 26, 2013

(51) Int. Cl.
*H02H 3/22* (2006.01)
*H02H 9/04* (2006.01)
*H01L 27/02* (2006.01)

(52) U.S. Cl.
CPC ............ *H02H 9/046* (2013.01); *H01L 27/0251* (2013.01); *H01L 27/0266* (2013.01)
USPC ............................................ 361/56; 361/111

(58) Field of Classification Search
USPC ............................. 361/56, 111; 257/355–360
See application file for complete search history.

(56) References Cited

U.S. PATENT DOCUMENTS

| | | | |
|---|---|---|---|
| 5,610,790 A * | 3/1997 | Staab et al. | 361/56 |
| 6,114,903 A * | 9/2000 | Bach | 327/565 |
| 7,542,253 B2 | 6/2009 | Ker | |
| 7,582,937 B2 | 9/2009 | Lai | |
| 7,646,063 B1 | 1/2010 | Boyd | |
| 7,763,941 B2 | 7/2010 | Kim | |
| 2003/0174452 A1* | 9/2003 | Chen et al. | 361/56 |
| 2008/0062596 A1* | 3/2008 | Miller et al. | 361/56 |

* cited by examiner

*Primary Examiner* — Danny Nguyen
(74) *Attorney, Agent, or Firm* — Winston Hsu; Scott Margo

(57) ABSTRACT

There is provided an integrated circuit includes an output driver and a configurable electrostatic discharging (ESD) power clamp element according to embodiments of the present invention. The output driver includes a first semiconductor element having a first conductivity type and electrically connected to a first power rail; and a second semiconductor element having a second conductivity type different from the first conductivity type and electrically connected to a second power rail. Specifically, the configurable ESD power clamp element is coupled between the first power rail and the second power rail to provide ESD protection when configured in a first hardware state, and forms a portion of the output driver when configured in a second hardware state, thereby increasing the design flexibility of the integrated circuit.

15 Claims, 14 Drawing Sheets

CONFIGURABLE ELECTROSTATIC DISCHARGING POWER CLAMP AND RELATED INTEGRATED CIRCUIT

BACKGROUND OF THE INVENTION

1. Field of the Invention

The present invention generally relates to electrostatic discharge protection, and more particularly to a semiconductor element that is configurable as an electrostatic discharge protection power clamp or a potion of an output driver.

2. Description of the Prior Art

Electrostatic discharge (ESD) problems are extremely important in electronic circuits since it may only take one ESD strike to permanently damage an integrated circuit, making ESD protection a critical component of the integrated circuit design. ESD is generally a high-voltage transient with fast rise time and fast decay time. It basically requires a clamping device to limit the surge voltage to a safe level for the integrated circuit or components being protected.

FIG. 1 illustrates an ESD protection mechanism to alleviate an ESD current between a power rail $V_{DD}$ and a power rail $V_{SS}$. As illustrated, ESD power clamp 20 can protect an output driver 10 formed by PMOS transistor MN0 and PMOS transistor MN0 from the damage caused by the ESD current between power rail s.

In general, ESD protection levels are determined by the composition of an ESD protection circuit, a layout for realizing the ESD protection circuit in an actual integrated circuit device, and a fabricating process used to fabricate the integrated circuit device. While ESD evaluation standards are the same irrespective of the type of integrated circuit device, the size of the integrated circuit device becomes increasingly small and the fabricating process becomes increasingly complicated as the degree of integration of the integrated circuit device becomes higher.

FIGS. 2-4 illustrate several possible ways of layout implementation of the above-mentioned circuit architecture.

With reference to FIG. 2, power rails $V_{DD}$ and $V_{SS}$ are placed between the P-type transistor array and the N-type transistor array and the power clamp is placed adjacent to P-type transistor array. Under such layout, since the power clamp occupies additional spaces, a whole size of the integrated circuit will be disadvantageously increased. Besides, as the power clamp is not close to the power rails $V_{DD}$ and $V_{SS}$, the ESD current may directly strike the P-type transistor array and/or the N-type transistor array.

With reference to FIG. 3, the power rails $V_{DD}$ and $V_{SS}$ are not placed between the P-type transistor array and the N-type transistor array and the power clamp is between the power rails $V_{DD}$ and $V_{SS}$. Under such layout, since the power rails $V_{DD}$ and $V_{SS}$ are not placed between the P-type transistor array and the N-type transistor array, the ESD current from power rails $V_{DD}$ to $V_{SS}$ will not be divided into half (compared to the layout of FIG. 2) such that the P-type transistor array and the N-type transistor array may be stroke by stronger ESD currents.

With reference to FIG. 4, the power rails $V_{DD}$ and $V_{SS}$ are placed between the P-type transistor array and the N-type transistor array and the power clamp is between the power rails $V_{DD}$ and $V_{SS}$. Under such layout, since available space for the power clamp is limited, the effect of the ESD protection will be poor.

Accordingly, it is necessary to develop an ESD protection power clamp and layout implementation to effectively perform an ESD protection function in a small area.

SUMMARY OF THE INVENTION

With this in mind, it is one objective of the present invention to provide an integrated circuit provided with an ESD power clamp element, wherein the ESD power clamp element is well positioned such that a whole size of integrated circuit can be maintained at a favorable level. It is another one objective of the present invention to provide an ESD power clamp element. The proposed ESD power clamp element is configurable between an ESD protection device and a portion of an output driver.

According to one aspect of the present invention, an integrated circuit is provided. The integrated circuit comprises: a first semiconductor element, a second semiconductor element and an electrostatic discharging (ESD) power clamp element. The first semiconductor element having a first conductivity type is electrically connected to a first power rail. The second semiconductor element having a second conductivity type that is different from the first conductivity type is electrically connected to a second power rail. The electrostatic discharging (ESD) power clamp element is electrically connected between the first power rail and the second power rail. Additionally, the ESD power clamp element is adjacent to the first power rail, and disposed between the first power rail and one of the first and second semiconductor elements.

According to another aspect of the present invention, an integrated circuit is provided. The integrated circuit comprises: an output driver and a configurable electrostatic discharging (ESD) power clamp element. The output driver comprises: a first semiconductor element and a second semiconductor element. The first semiconductor element having a first conductivity type is electrically connected to a first power rail. The second semiconductor element having a second conductivity type that is different from the first conductivity type is electrically connected to a second power rail. Additionally, the configurable ESD power clamp element is coupled between the first power rail and the second power rail to provide ESD protection when configured in a first hardware state, and forms a portion of the output driver when configured in a second hardware state.

According to yet another aspect of the present invention, a method for configuring an integrated circuit is provided. The method comprises: providing an output driver and during a fabrication process of the integrated circuit, configuring an electrostatic discharging (ESD) power clamp element to couple between the first power rail and the second power rail for ESD protection or to form a portion of the output driver. Additionally, the output driver comprises: a first semiconductor element and a second semiconductor element. The first semiconductor element having a first conductivity type is electrically connected to a first power rail. The second semiconductor element having a second conductivity type that is different from the first conductivity type is electrically connected to a second power rail.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following descriptions and claims to refer to particular system components. As one skilled in the art will appreciate, manufacturers may refer to a component by different names. This document does not intend to distinguish between components that differ in name but not differ in functionality. In the following discussion and in the claims, the terms "include", "including", "comprise", and "comprising" are used in an open-ended fashion, and thus should be interpreted to mean "including, but not limited to . . . ." The terms "couple" and "coupled" are intended to mean either an indirect or a direct electrical connection. Thus, if a first device couples to a second device, that connection may be through a direct electrical connection, or through an indirect electrical connection via other devices and connections.

First Embodiment

Figure 5A:
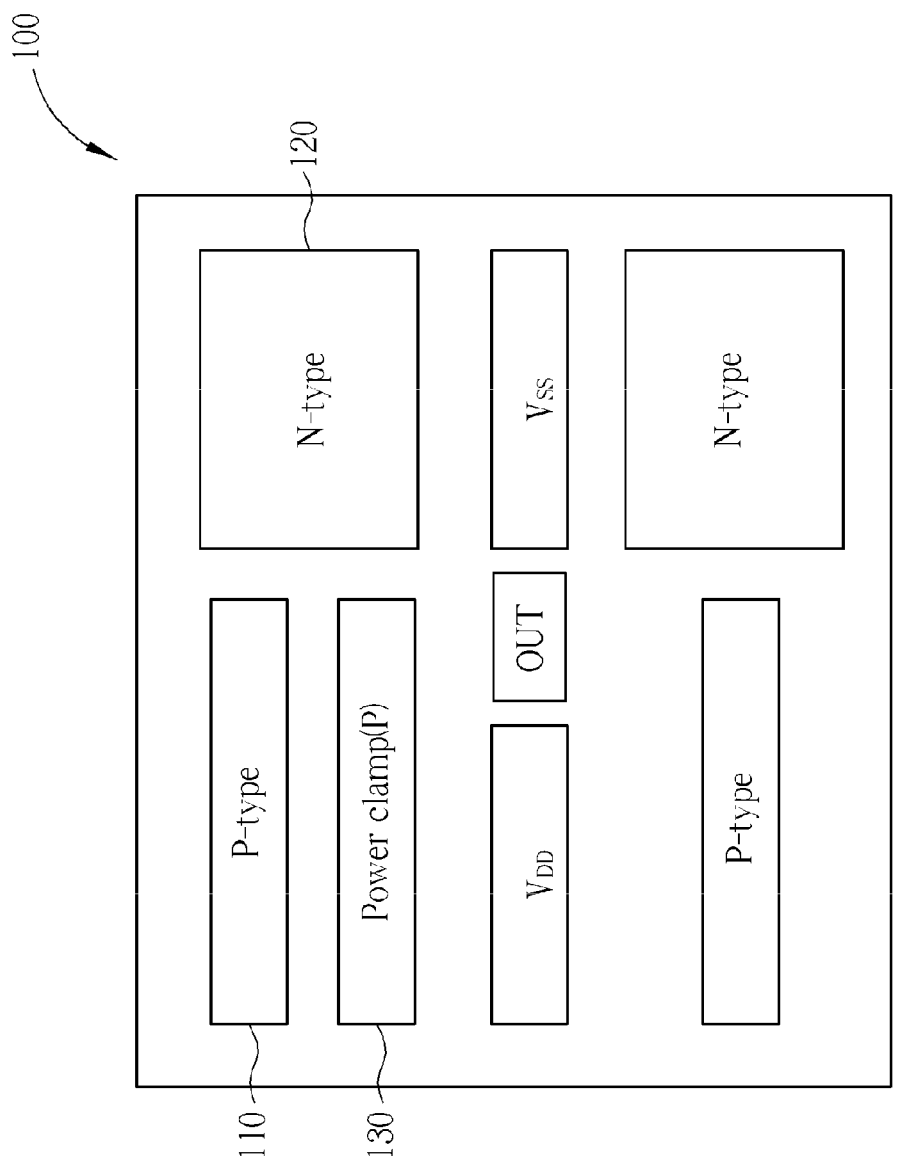
FIGS. 5A-5D illustrate an integrated circuit according to a first embodiment of the present invention.

According to a first embodiment of the present invention, an integrated circuit is provided as illustrated in FIG. 5A in a simplified layout level. As shown, the integrated circuit 100 comprises: a first semiconductor element 110 and a second semiconductor element 120. Preferably, the first semiconductor element 110 is P-conductivity type while the second semiconductor element 120 is N-conductivity type. Additionally, the first semiconductor element 110 is electrically connected to a first power rail via metal interconnection $V_{DD}$ (not shown) while the second semiconductor element 120 is electrically connected to a second power rail $V_{ss}$ via metal interconnection (not shown). The first semiconductor element 110 and the second semiconductor element 120 may form a CMOS output driver and generate an output to a pad OUT, wherein the first semiconductor element 110 may comprise a transistor array including one or more PMOS transistors and the second semiconductor element 120 may comprise a transistor array including one or more NMOS transistors. The integrated circuit 100 also includes an electrostatic discharging (ESD) power clamp element 130 is configurable between a first hardware state and a second hardware state. In the layout level, the position of the ESD power clamp element 130 is placed to be adjacent to the first power rail $V_{DD}$, and between the first power rail $V_{DD}$ and the first semiconductor elements 110.

Figure 5B:
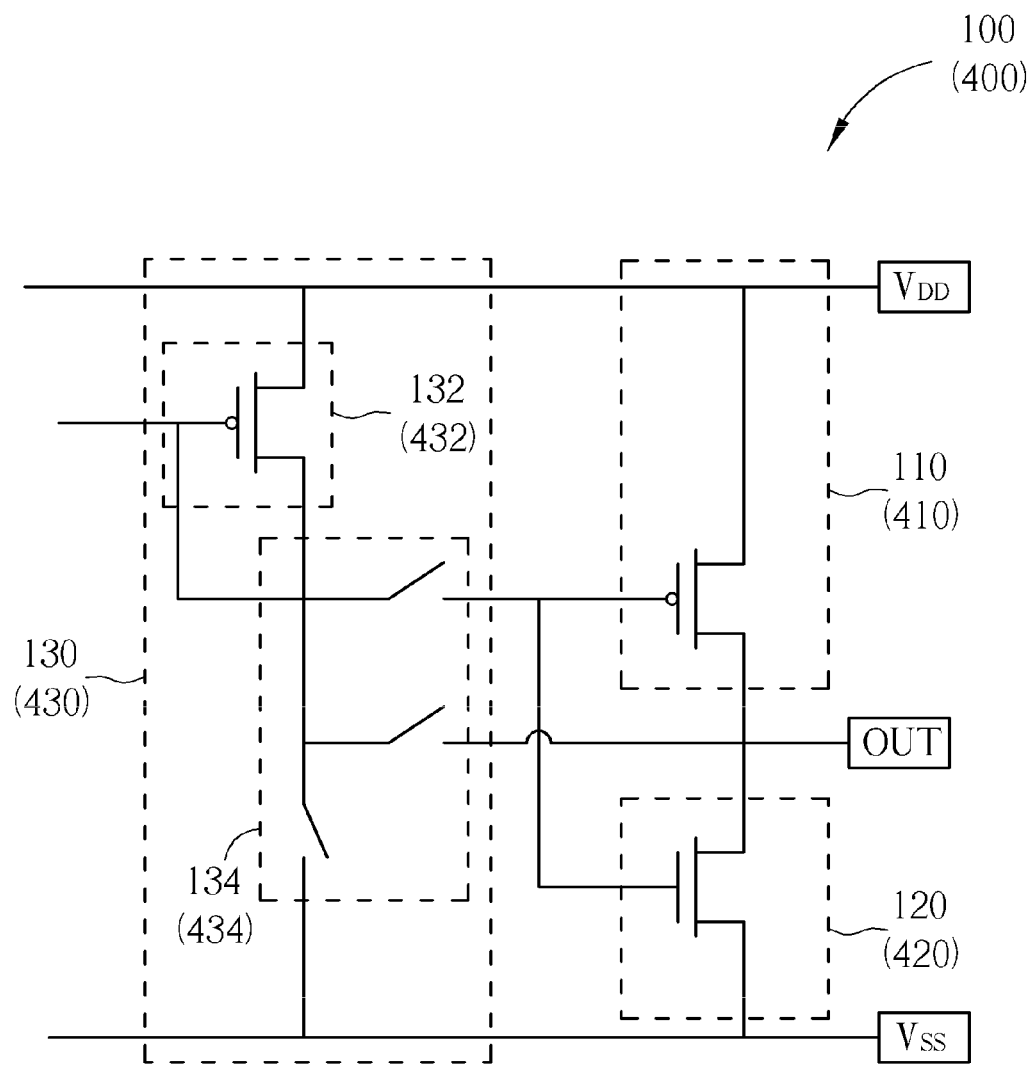

As expressly shown in FIG. 5B, the ESD power clamp element 130 comprises: a third semiconductor element 132 and a hardware state setting element 134. The third semiconductor element 132 is a P conductivity type element and may comprise a transistor array including one or more PMOS transistors. The hardware state setting element 134 is coupled to the third semiconductor element 132, and employed for configuring the ESD power clamp element 130 to have the first hardware state or the second hardware state. Depending on different embodiments of the present invention, the hardware state setting element 134 may comprise either a plurality of switches or a plurality of electrical fuses (e-fuses), to configure the ESD power clamp element 130.

Figure 5C:
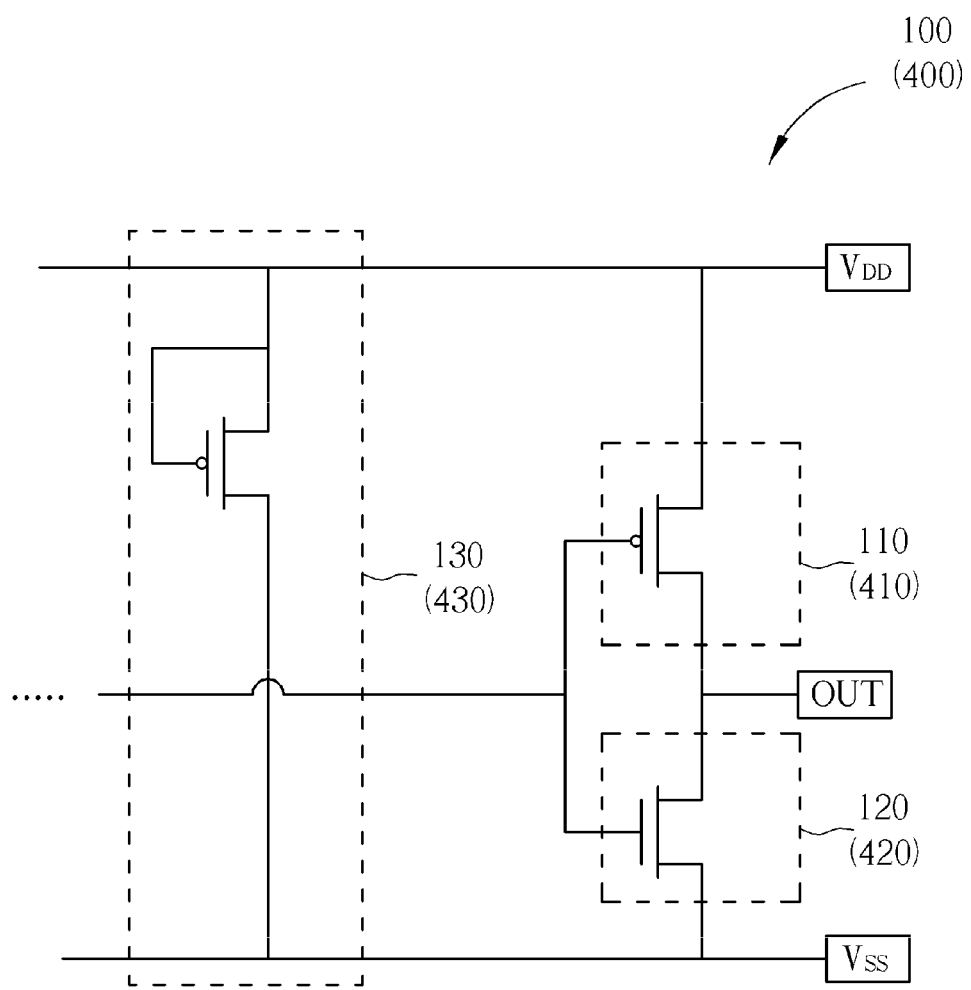
Figure 5D:
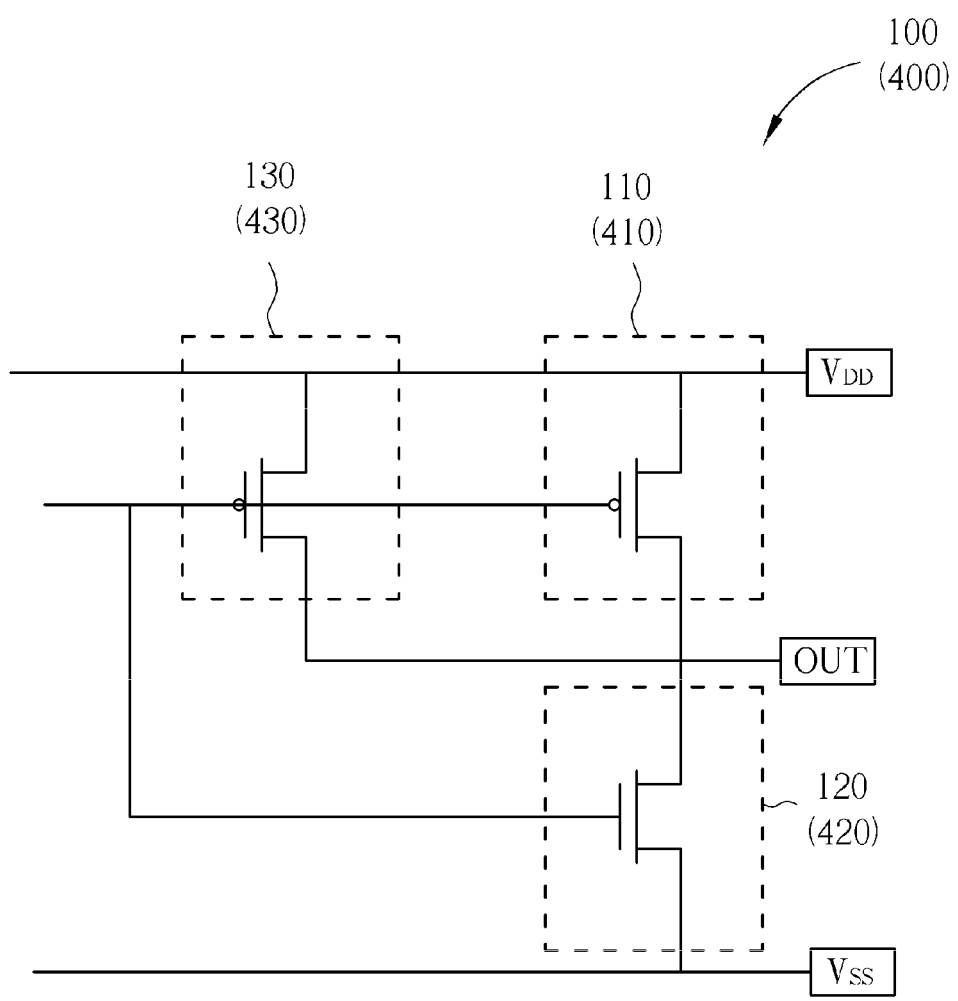

In the first hardware state, as shown in FIG. 5C, the ESD power clamp element 130 will be electrically connected between the first power rail $V_{DD}$ and the second power rail $V_{ss}$ via original metal interconnection and the switches or e-fuses. In such state, the ESD power clamp element 130 provides ESD protection for the CMOS output driver made up of the first semiconductor element 110 and the second semiconductor element 120. In the second hardware state, as shown in FIG. 5D, the third semiconductor element 132 will act as a portion of the output driver. That is, the first semiconductor element 110 and the third semiconductor element 134 are connected in a parallel fashion. As a consequence, the third semiconductor element 134 forms a portion of the CMOS output driver and the driving capability of the CMOS driver can be therefore enhanced.

Figure 1:
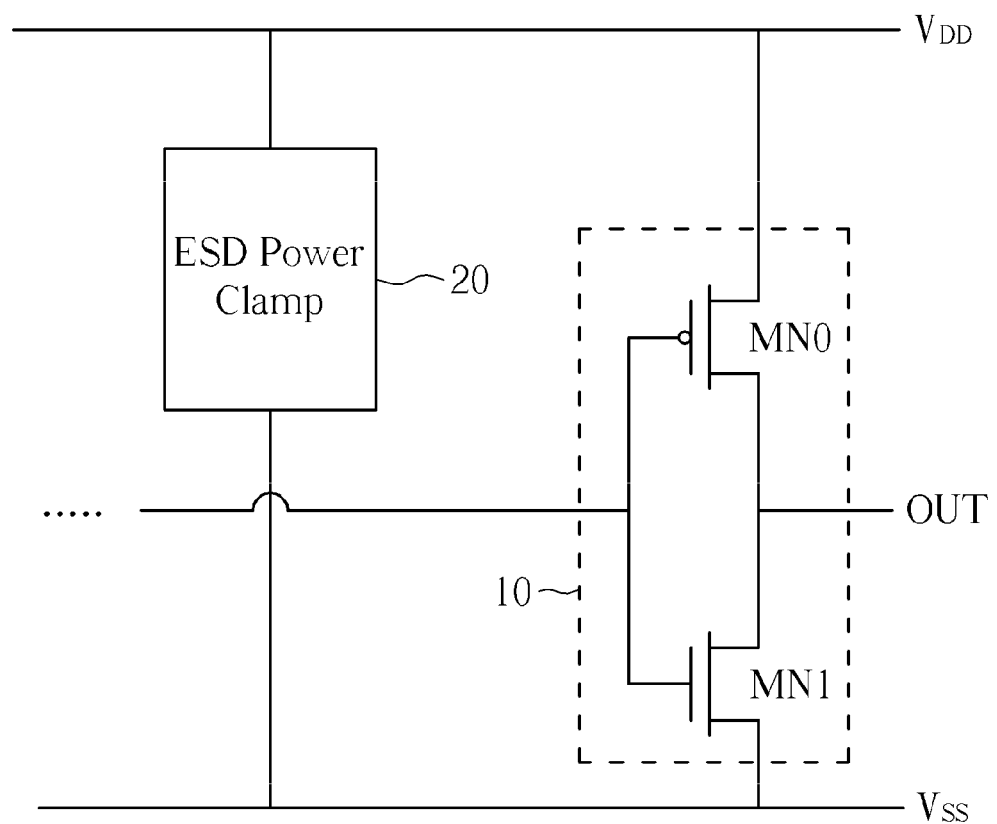
FIG. 1 illustrates a conventional ESD power clamp and an output driver.
Figure 2:
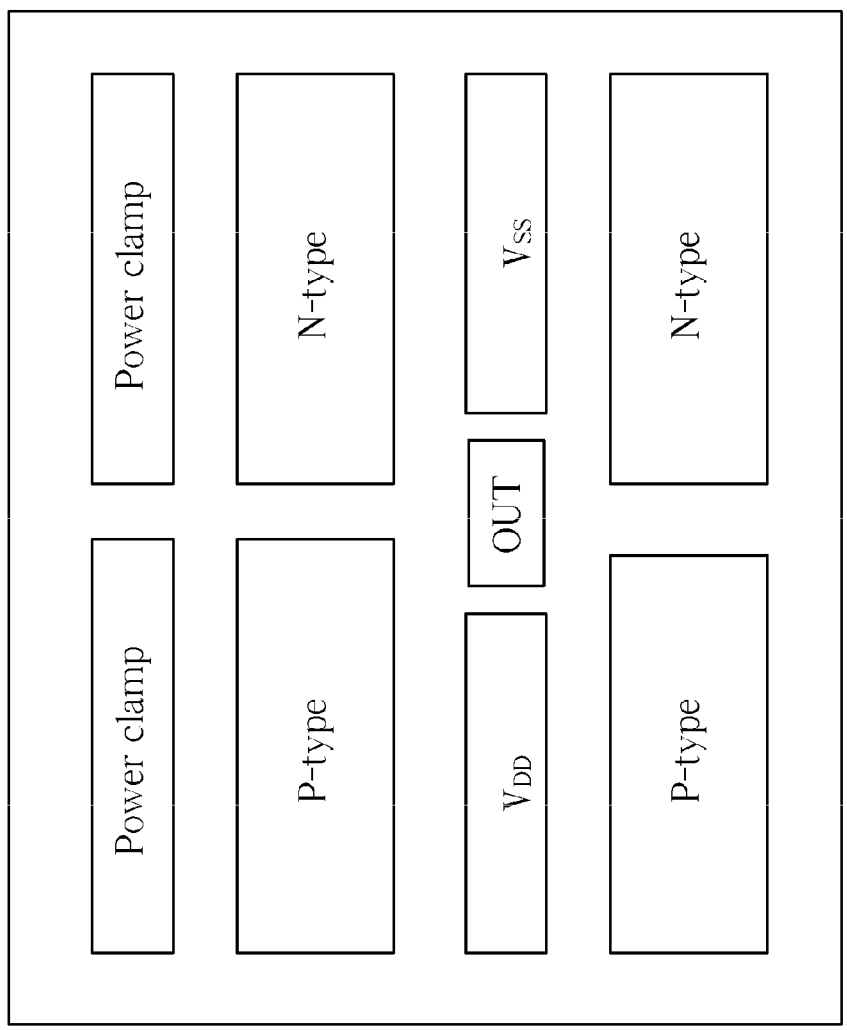
FIGS. 2-4 illustrate possible ways of layout implementation of an ESD power clamp and an output driver.

In this embodiment, to maintain the chip size of the integrated circuit 100 at a favorable level, it is necessary to adjust the shaping of the area of the first semiconductor element 110 in the layout. Supposed that the first semiconductor element 110 is disposed in a first chip area, and the second semiconductor element is 120 disposed in a second chip area, a length of the second chip area is smaller than a length of the first chip area, and a width of the second chip area is larger than a width of the first chip area. As a result, the whole size of the integrated circuit 100 can be smaller than that of the integrated circuit shown in FIG. 2.

Second Embodiment

Figure 6A:
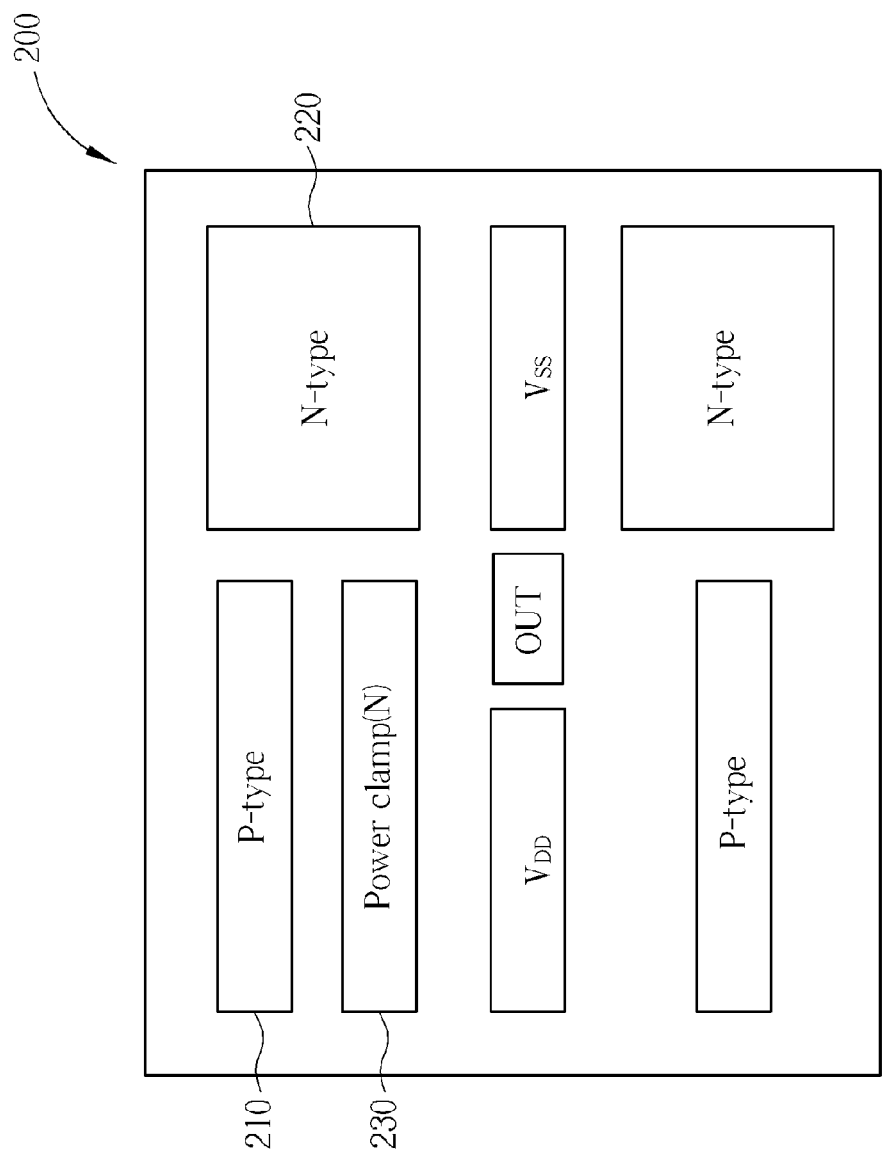
FIGS. 6A-6D illustrate an integrated circuit according to a second embodiment of the present invention.

According to a second embodiment of the present invention, an integrated circuit is provided as illustrated in FIG. 6A in a simplified layout level, wherein the second embodiment provides a different implementation aspect, especially about the implementation of the ESD power clamp element. As shown, the integrated circuit 200 comprises: a first semiconductor element 210 and a second semiconductor element 220. Preferably, the first semiconductor element 210 is P-conductivity type while the second semiconductor element 220 is N-conductivity type. Additionally, the first semiconductor element 210 is electrically connected to a first power rail $V_{DD}$ via metal interconnection (not shown) $V_{DD}$ while the second semiconductor element 220 is electrically connected to a second power rail $V_{ss}$ via metal interconnection (not shown). The first semiconductor element 210 and the second semiconductor element 220 may form a CMOS output driver and generate an output to a pad OUT, wherein the first semiconductor element 210 may comprise a transistor array including one or more PMOS transistors and the second semiconductor element 120 may comprise a transistor array including one or more NMOS transistors. The integrated circuit 100 also includes an electrostatic discharging (ESD) power clamp element 230 is configurable between a first hardware state and a second hardware state. In the layout level, the position of the ESD power clamp element 230 is adjacent to the first power rail $V_{DD}$, and between the first power rail $V_{DD}$ and the first semiconductor elements 110.

Figure 6B:
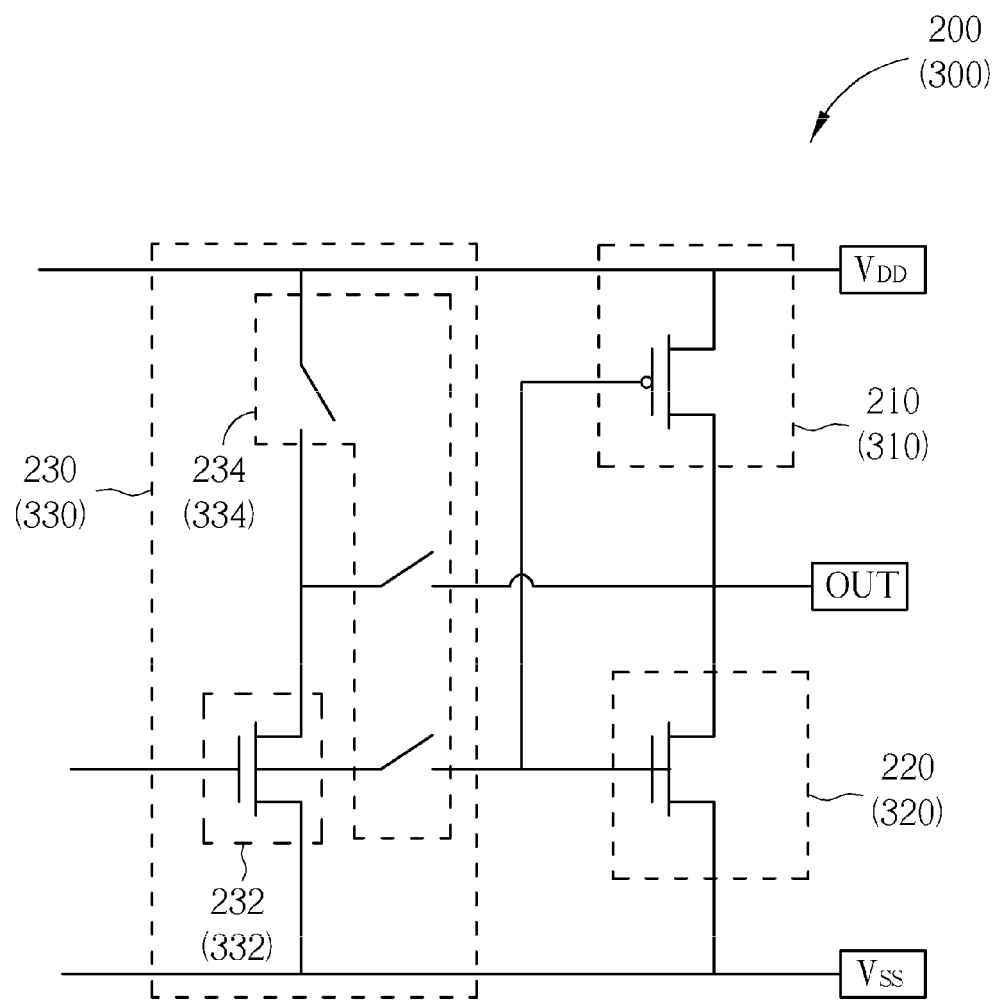

As expressly shown in FIG. 6B, the ESD power clamp element 230 comprises: a third semiconductor element 232 and a hardware state setting element 234. Different to the first embodiment, the third semiconductor element 232 is now an N conductivity type element and may comprise a transistor array including one or more NMOS transistors. The hardware state setting element 234 is coupled to the third semiconductor element 132, and employed for configuring the ESD power clamp element 130 to have the first hardware state or the second hardware state. Depending on different embodiments of the present invention, the hardware state setting element 234 may comprise either a plurality of switches or a plurality of electrical fuses (e-fuses), to configure the ESD power clamp element 230.

Figure 6C:
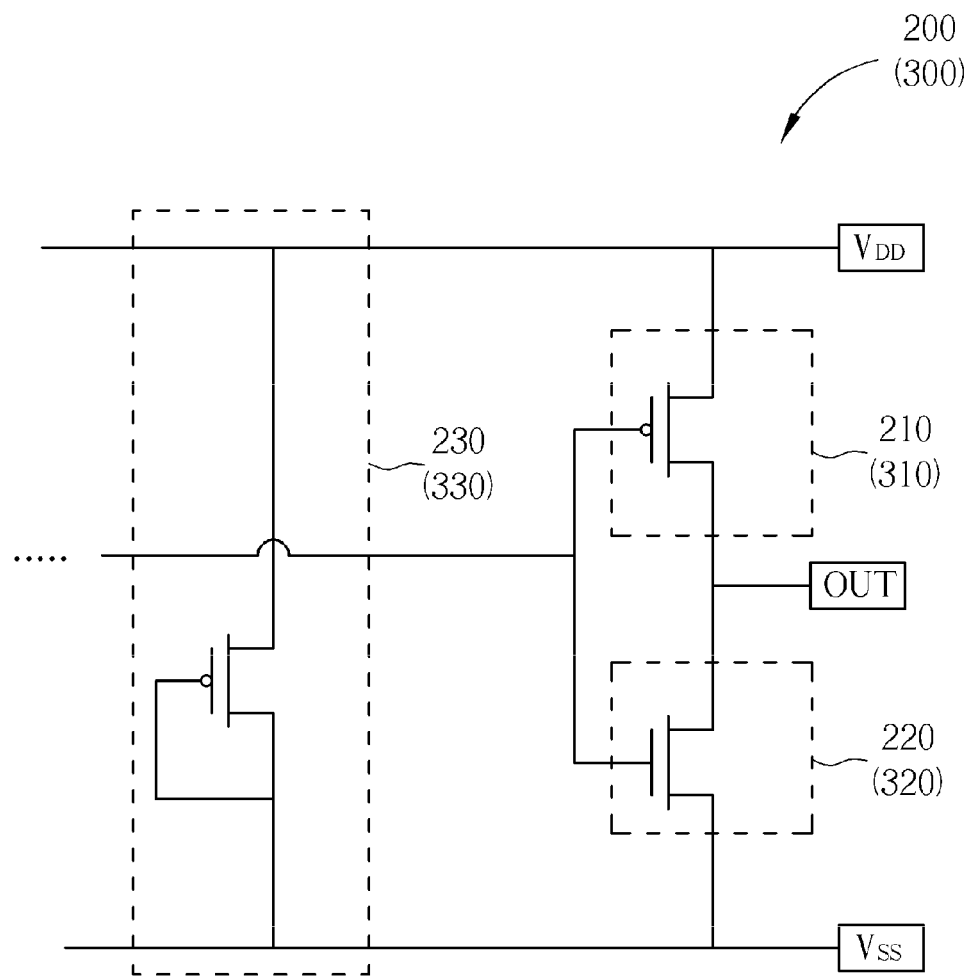
Figure 6D:
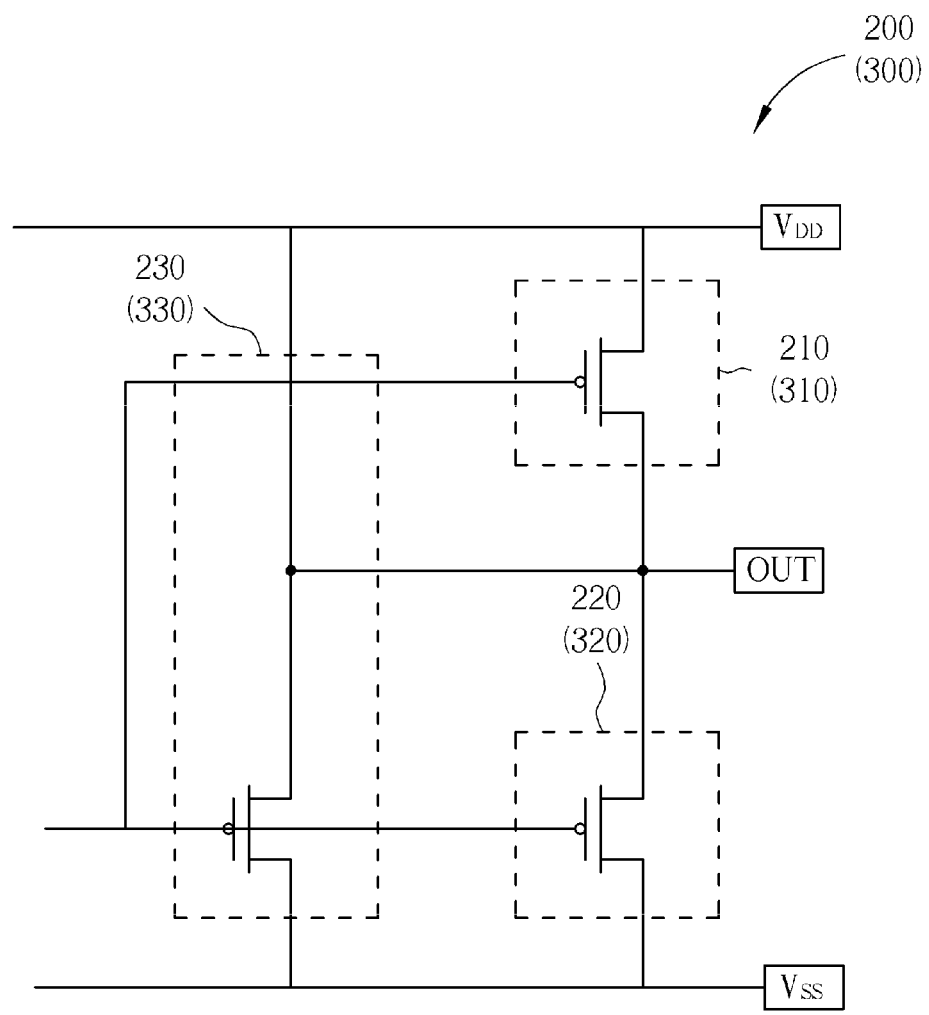

In the first hardware state shown in FIG. 6C, the ESD power clamp element 230 will be electrically connected between the first power rail $V_{DD}$ and the second power rail $V_{ss}$ via original metal interconnection and the switches or e-fuses. In such state, the ESD power clamp element 230 provides ESD protection for the CMOS output driver made up of the first semiconductor element 210 and the second semiconductor element 220. In the second hardware state, as shown in FIG. 6D, the third semiconductor element 132 will act as a portion of the output driver. That is, the second semiconductor element 220 and the third semiconductor element 234 are connected in a parallel fashion. As a consequence, the third semiconductor element 234 forms a portion of the CMOS output driver and the driving capability of the CMOS driver can be therefore enhanced.

In this embodiment, to maintain the chip size of the integrated circuit 200 at a favorable level, it is necessary to adjust the shaping of the area of the first semiconductor element 210 in the layout. Supposed that the first semiconductor element 210 is disposed in a first chip area, and the second semiconductor element is 220 disposed in a second chip area, a length of the second chip area is smaller than a length of the first chip area, and a width of the second chip area is larger than a width of the first chip area. As a result, the whole size of the integrated circuit 200 can be smaller than that of the integrated circuit shown in FIG. 2.

Third Embodiment

Figure 7:
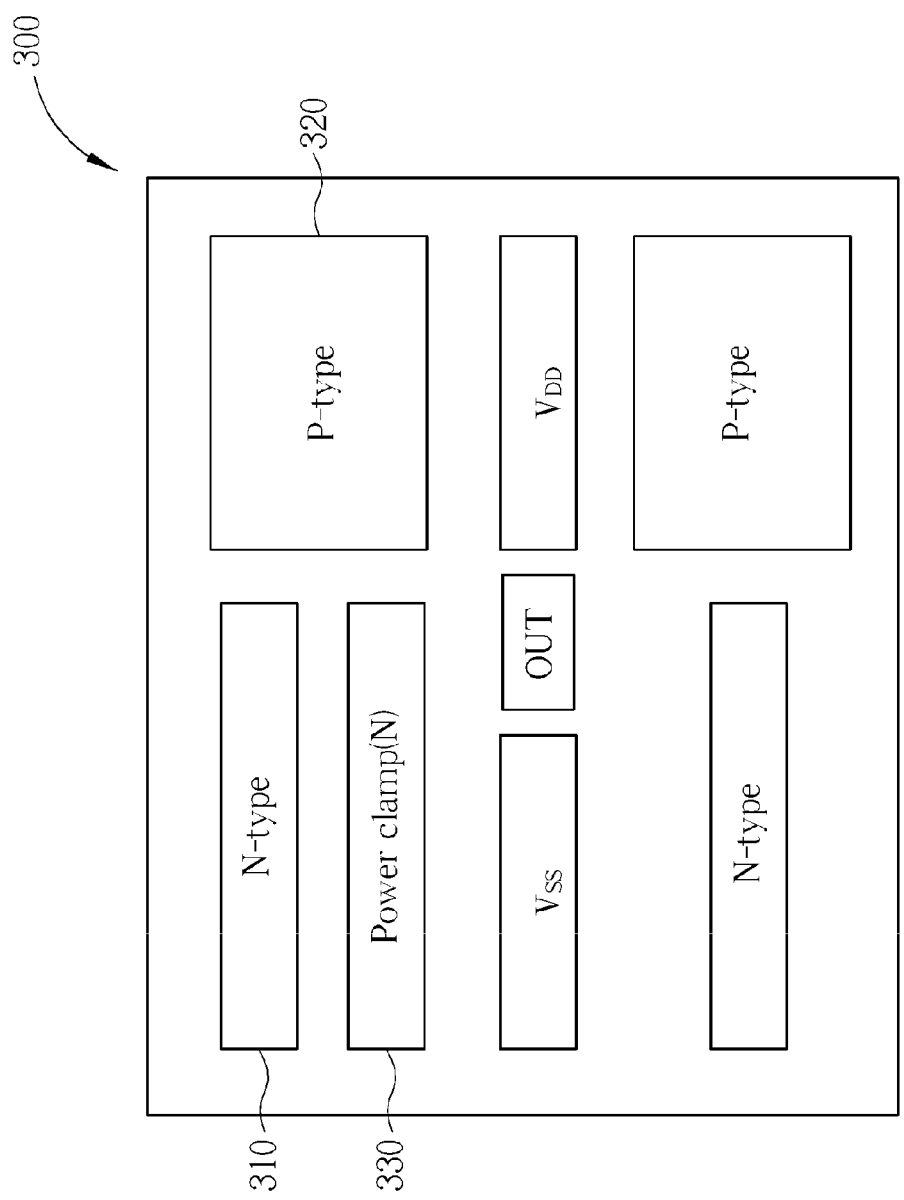
FIG. 7 illustrates an integrated circuit according to a third embodiment of the present invention.

According to a third embodiment of the present invention, an integrated circuit is provided as illustrated in FIG. 7 in a simplified layout level. As shown, the integrated circuit 300 comprises: a first semiconductor element 310 and a second semiconductor element 320. Preferably, the first semiconductor element 310 is N-conductivity type while the second semiconductor element 320 is P-conductivity type. Additionally, the first semiconductor element 310 is electrically connected to a first power rail via metal interconnection $V_{ss}$ (not shown) while the second semiconductor element 320 is electrically connected to a second power rail $V_{DD}$ via metal interconnection (not shown). The first semiconductor element 310 and the second semiconductor element 320 may form a CMOS output driver and generate an output to a pad OUT, wherein the first semiconductor element 310 may comprise a transistor array including one or more NMOS transistors and the second semiconductor element 320 may comprise a transistor array including one or more PMOS transistors. The integrated circuit 300 also includes an electrostatic discharging (ESD) power clamp element 330 is configurable between a first hardware state and a second hardware state. In the layout level, the position of the ESD power clamp element 330 is adjacent to the first power rail $V_{ss}$, and between the first power rail $V_{ss}$ and the first semiconductor elements 310.

Similarly as that shown in FIG. 6B, the ESD power clamp element 330 comprises: a third semiconductor element 332 and a hardware state setting element 334. The third semiconductor element 332 is an N conductivity type element and may comprise a transistor array including one or more NMOS transistors. The hardware state setting element 334 is coupled to the third semiconductor element 332, and employed for configuring the ESD power clamp element 330 to have the first hardware state or the second hardware state. Depending on different embodiments of the present invention, the hardware state setting element 334 may comprise either a plurality of switches or a plurality of electrical fuses (e-fuses), to configure the ESD power clamp element 130.

In the first hardware state, similarly as that shown in FIG. 6C, the ESD power clamp element 330 will be electrically connected between the first power rail $V_{SS}$ and the second power rail $V_{DD}$ via original metal interconnection and the switches or e-fuses. In such state, the ESD power clamp element 330 provides ESD protection for the CMOS output driver made up of the first semiconductor element 310 and the second semiconductor element 320. In the second hardware state, similarly as that shown in FIG. 6D, the third semiconductor element 332 will act as a portion of the output driver. That is, the first semiconductor element 310 and the third semiconductor element 334 are connected in a parallel fashion. As a consequence, the third semiconductor element 334 forms a portion of the CMOS output driver and the driving capability of the CMOS driver can be therefore enhanced.

In this embodiment, to maintain the chip size of the integrated circuit 300 at a favorable level, it is necessary to adjust the shaping of the area of the first semiconductor element 310 in the layout. Supposed that the first semiconductor element 310 is disposed in a first chip area, and the second semiconductor element is 320 disposed in a second chip area, a length of the second chip area is smaller than a length of the first chip area, and a width of the second chip area is larger than a width of the first chip area. As a result, the whole size of the integrated circuit 300 can be smaller than that of the integrated circuit shown in FIG. 2.

Fourth Embodiment

Figure 8:
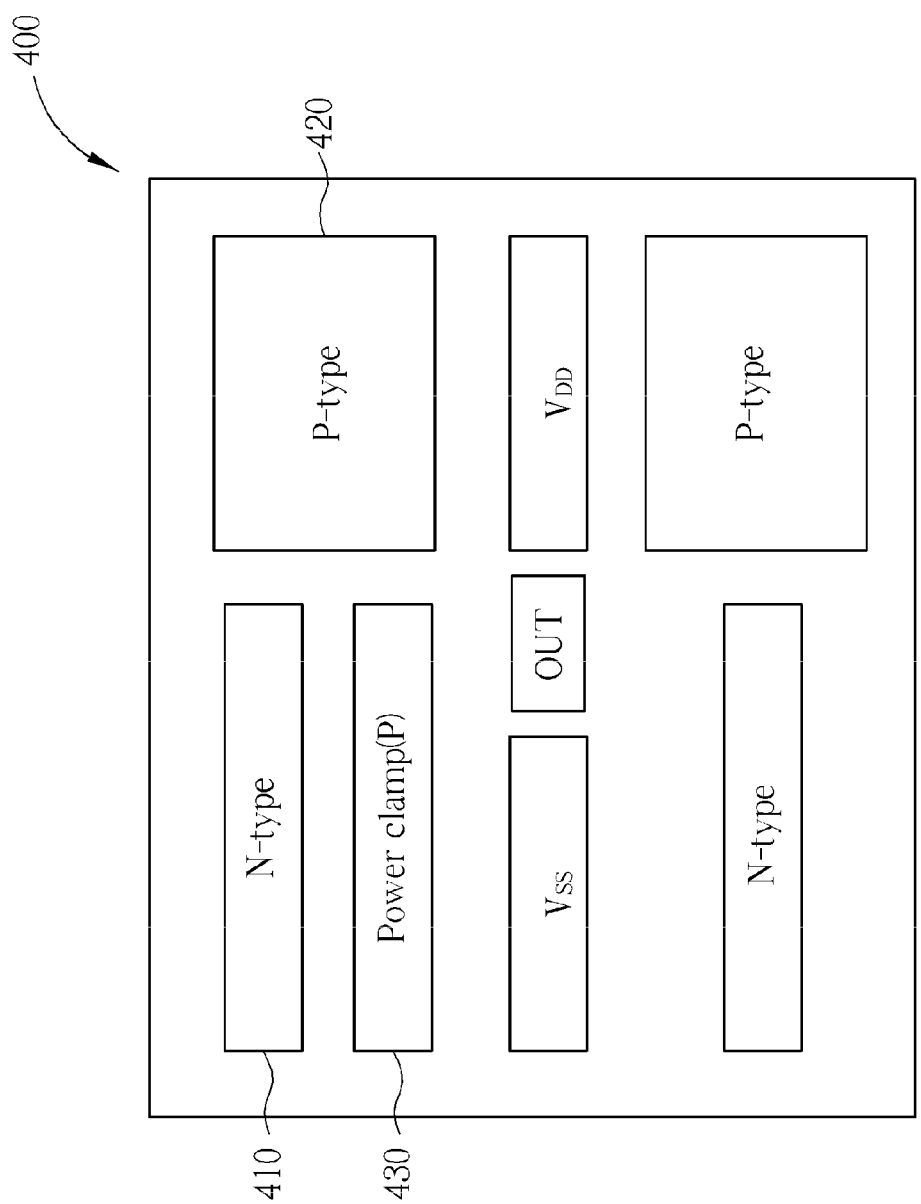
FIG. 8 illustrates an integrated circuit according to a fourth embodiment of the present invention.

According to a fourth embodiment of the present invention, an integrated circuit is provided as illustrated in FIG. 8 in a simplified layout level. As shown, the integrated circuit 400 comprises: a first semiconductor element 410 and a second semiconductor element 420. Preferably, the first semiconductor element 410 is N-conductivity type while the second semiconductor element 420 is P-conductivity type. Additionally, the first semiconductor element 410 is electrically connected to a first power rail via metal interconnection $V_{ss}$ (not shown) while the second semiconductor element 420 is electrically connected to a second power rail $V_{DD}$ via metal interconnection (not shown). The first semiconductor element 410 and the second semiconductor element 420 may form a CMOS output driver and generate an output to a pad OUT, wherein the first semiconductor element 410 may comprise a transistor array including one or more NMOS transistors and the second semiconductor element 420 may comprise a transistor array including one or more PMOS transistors. The integrated circuit 400 also includes an electrostatic discharging (ESD) power clamp element 430 is configurable between a first hardware state and a second hardware state. In the layout level, the position of the ESD power clamp element 430 is adjacent to the first power rail $V_{ss}$, and between the first power rail $V_{ss}$ and the first semiconductor elements 410.

Similarly as that shown in FIG. 5B, the ESD power clamp element 430 comprises: a third semiconductor element 432 and a hardware state setting element 434. The third semiconductor element 432 is a P conductivity type element and may comprise a transistor array including one or more PMOS transistors. The hardware state setting element 434 is coupled to the third semiconductor element 432, and employed for configuring the ESD power clamp element 330 to have the first hardware state or the second hardware state. Depending on different embodiments of the present invention, the hardware state setting element 434 may comprise either a plurality of switches or a plurality of electrical fuses (e-fuses), to configure the ESD power clamp element 130.

In the first hardware state, similarly as that shown in FIG. 5C, the ESD power clamp element 430 will be electrically connected between the first power rail $V_{SS}$ and the second power rail $V_{DD}$ via original metal interconnection and the switches or e-fuses. In such state, the ESD power clamp element 430 provides ESD protection for the CMOS output driver made up of the first semiconductor element 410 and the second semiconductor element 420. In the second hardware state, similarly as that shown in FIG. 5D, the third semiconductor element 432 will act as a portion of the output driver. That is, the first semiconductor element 410 and the third semiconductor element 434 are connected in a parallel fashion. As a consequence, the third semiconductor element 434 forms a portion of the CMOS output driver and the driving capability of the CMOS driver can be therefore enhanced.

In this embodiment, to maintain the chip size of the integrated circuit 400 at a favorable level, it is necessary to adjust the shaping of the area of the first semiconductor element 410 in the layout. Supposed that the first semiconductor element 410 is disposed in a first chip area, and the second semiconductor element is 420 disposed in a second chip area, a length of the second chip area is smaller than a length of the first chip area, and a width of the second chip area is larger than a width of the first chip area. As a result, the whole size of the integrated circuit 400 can be smaller than that of the integrated circuit shown in FIG. 2.

Furthermore, in addition to the third semiconductor element 134, 234, 334 and 434, the ESD power clamp element 130, 230, 330 and 430 may further comprise fourth semiconductor elements (not shown) to permanently provide ESD protection function. This is because once the third semiconductor element 134, 234, 334 and 434 are configured to act as a portion of the CMOS output driver, there are still fourth semiconductor elements can still provide ESD protection function for the CMOS output driver.

In another embodiment of the present invention, the configuration of the inventive ESD power clamp element may be done during a fabrication process. For example, the metal interconnections between the power rails and the semiconductor element can be determined by mask. Then, the actual metal interconnection will be formed after a etch process.

Reference in the specification to "one embodiment" or "an embodiment" means that a particular feature, structure, or characteristic described in connection with the embodiment is included in at least an implementation. The appearances of the phrase "in one embodiment" in various places in the specification are not necessarily all referring to the same embodiment. Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

Figure 3:
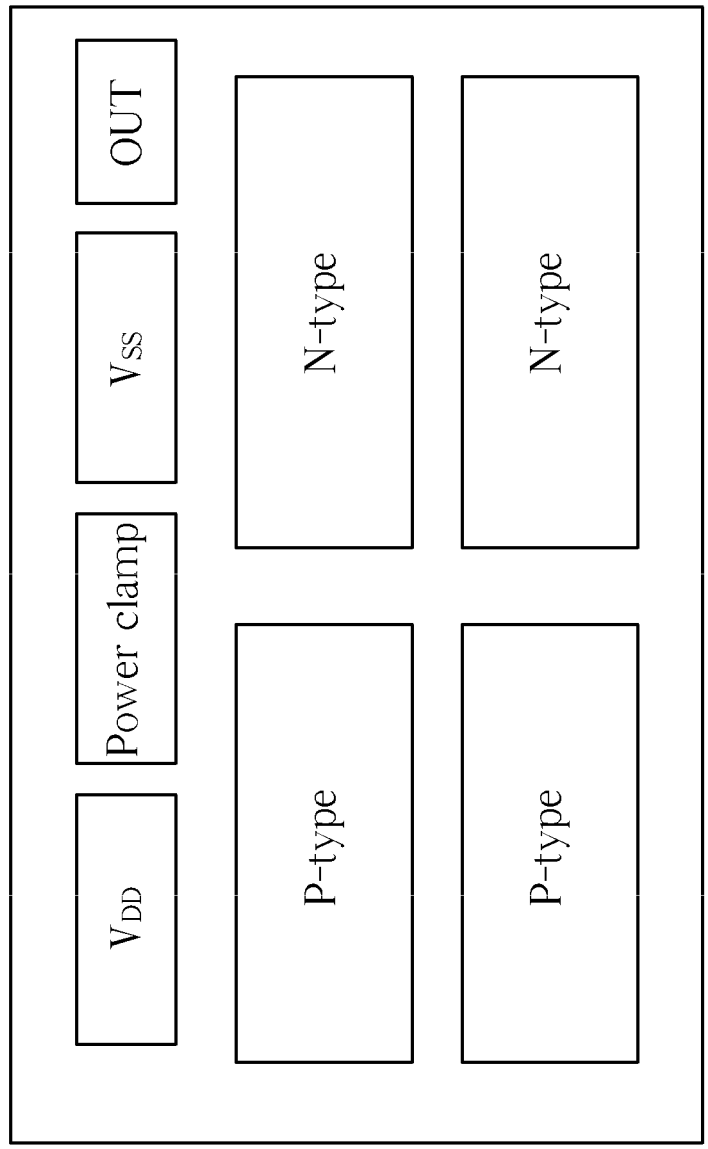
Figure 4:
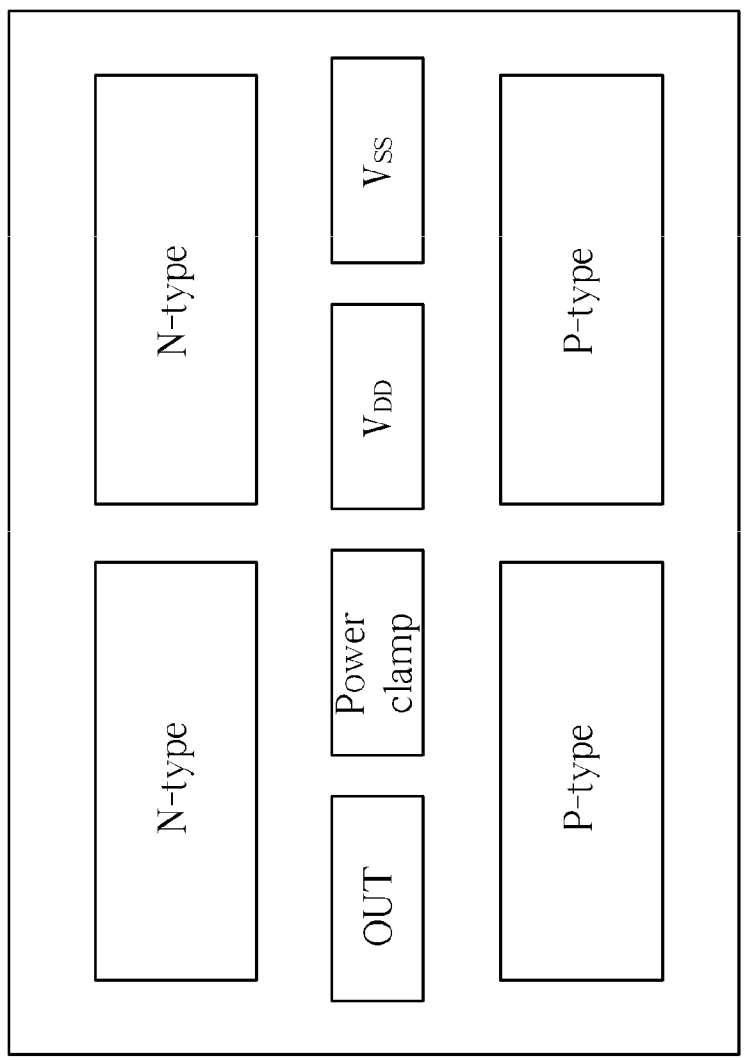

In conclusion, there are two significant advantages provided in the present invention. Firstly, the chip size, as the ESD power clamp element is placed adjacent to the power rails $V_{DD}$ and $V_{SS}$ and the power rails $V_{DD}$ and $V_{SS}$ is placed between the N type transistor array and the P type transistor array, the ESD power clamp element can effectively provide the ESD protection compared to w placements illustrated in FIGS. 2-4. For example, as the ESD power clamp element is placed adjacent to the power rails $V_{DD}$ and $V_{SS}$, the ESD current will not be allowed to directly strike the N type transistor array and the P type transistor array. Also, as the power rails $V_{DD}$ and $V_{SS}$ is placed between the N type transistor array and the P type transistor array, the N type transistor array and the P type transistor array will not be stroke by stronger ESD currents. This is because the ESD current will be distributed in half to the N type transistor array and the P type transistor array, respectively.

Secondly, the flexibility, the present invention can allow the designers to choose different functions of ESD power clamp element 130, 230, 330 and 430, either to provide ESD protection or to improve the driving capability of the output driver, to meet designers' respective requirements. In view of this, the present invention maximizes the design flexibility of the integrated circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit, comprising:
    a first semiconductor element, having a first conductivity type and electrically connected to a first power rail;
    a second semiconductor element, having a second conductivity type different from the first conductivity type and electrically connected to a second power rail; and
    an electrostatic discharging (ESD) power clamp element, electrically connected between the first power rail and the second power rail;
    wherein the ESD power clamp element is adjacent to the first power rail, and directly sandwiched between the first power rail and one of the first and second semiconductor elements.

2. The integrated circuit of claim 1, wherein the first power rail is a high voltage rail, the second power rail is a low voltage rail, the first conductivity type is an P-type, the second conductivity type is a N-type, and the ESD power clamp element is directly sandwiched between the high voltage rail and the first semiconductor element.

3. The integrated circuit of claim 2, wherein the first semiconductor element is disposed in a first chip area, the second semiconductor element is disposed in a second chip area, a length of the second chip area is smaller than a length of the first chip area, and a width of the second chip area is larger than a width of the first chip area.

4. The integrated circuit of claim 1, wherein the first power rail is a high voltage rail, the second power rail is a low voltage rail, the first conductivity type is an N-type, the second conductivity type is a P-type, and the ESD power clamp element is directly sandwiched between the low voltage rail and the first semiconductor element.

5. The integrated circuit of claim 4, wherein the first semiconductor element is disposed in a first chip area, the second semiconductor element is disposed in a second chip area, a length of the second chip area is smaller than a length of the first chip area, and a width of the second chip area is larger than a width of the first chip area.

6. The integrated circuit of claim 1, wherein the first and second semiconductor elements form an output driver.

7. An integrated circuit, comprising:
    an output driver, comprising:
        a first semiconductor element, having a first conductivity type and electrically connected to a first power rail; and
        a second semiconductor element, having a second conductivity type different from the first conductivity type and electrically connected to a second power rail; and a configurable electrostatic discharging (ESD) power clamp element;

wherein the configurable ESD power clamp element is coupled between the first power rail and the second power rail to provide ESD protection when configured in a first hardware state, and forms a portion of the output driver when configured in a second hardware state.

8. The integrated circuit of claim 7, wherein the configurable ESD power clamp element comprises:

a third semiconductor element, having the second conductivity type; and a hardware state setting element, coupled to the third semiconductor element, for configuring the configurable ESD power clamp element to have the first hardware state or the second hardware state.

9. The integrated circuit of claim 8, wherein when the configurable ESD power clamp element is configured in the second hardware state, the second semiconductor element and the third semiconductor element are connected in a parallel fashion.

10. The integrated circuit of claim 8, wherein the hardware state setting element comprises a plurality of switches.

11. The integrated circuit of claim 8, wherein the hardware state setting element comprises a plurality of electrical fuses (e-fuses).

12. The integrated circuit of claim 2, wherein the ESD power clamp element includes an N-conductivity type semiconductor element.

13. The integrated circuit of claim 2, wherein the ESD power clamp element includes a P-conductivity type semiconductor element.

14. The integrated circuit of claim 4, wherein the ESD power clamp element includes an N-conductivity type semiconductor element.

15. The integrated circuit of claim 4, wherein the ESD power clamp element includes a P-conductivity type semiconductor element.

* * * * *